United States Patent [19]

McGinniss

[11] 3,959,100

[45] May 25, 1976

[54] PHOTOPOLYMERIZABLE COATING COMPOSITIONS CONTAINING ACTIVATED HALOGENATED AZINE PHOTOINITIATOR AND PROCESS FOR MAKING SAME

[75] Inventor: Vincent Daniel McGinniss, Valley City, Ohio

[73] Assignee: SCM Corporation, Cleveland, Ohio

[22] Filed: Sept. 23, 1974

[21] Appl. No.: 508,126

Related U.S. Application Data

[63] Continuation-in-part of Ser. No. 413,830, Nov. 8, 1973, Pat. No. 3,857,769.

[52] U.S. Cl. ................ 204/159.15; 204/159.16; 204/159.17; 204/159.18; 204/159.23; 204/159.24; 260/2.5 B; 260/42.21; 260/42.52; 260/77.5 CR; 260/836; 260/837 R; 260/862; 260/864; 260/868; 427/54; 96/115 P; 526/75; 526/179; 526/193; 526/219; 526/220; 526/320

[51] Int. Cl.² ...................... C08F 8/00; C08F 2/46; C08F 4/00

[58] Field of Search ................ 204/159.18, 159.23, 204/159.24, 159.15, 159.10, 159.17; 96/115 P

[56] References Cited

UNITED STATES PATENTS

| | | | |
|---|---|---|---|
| 3,751,259 | 8/1973 | Baver et al. ................ 96/115 P |
| 3,787,212 | 1/1974 | Heimsch et al. .................... 96/35.1 |
| 3,804,631 | 4/1974 | Faust ................................. 96/115 P |
| 3,857,769 | 12/1974 | McGinniss ..................... 204/159.24 |
| 3,857,885 | 12/1974 | Faust ............................. 260/561 N |

*Primary Examiner*—Richard B. Turer
*Attorney, Agent, or Firm*—Merton H. Douthitt; S. I. Khayat

[57] ABSTRACT

Ultraviolet polymerization of photopolymerizable binders or vehicles is improved by incorporating thereinto a sensitizer composition comprising an activated halogenated azine compound.

6 Claims, No Drawings

PHOTOPOLYMERIZABLE COATING COMPOSITIONS CONTAINING ACTIVATED HALOGENATED AZINE PHOTOINITIATOR AND PROCESS FOR MAKING SAME

CROSS REFERENCE TO RELATED APPLICATIONS

The present patent application is a continuation-in-part of application Ser. No. 413,830 filed Nov. 8, 1973 and now U.S. Pat. No. 3,857,769. Also, this application is related to my co-pending application Ser. No. 357,479 filed May 4, 1973 and now U.S. Pat. No. 3,876,579. Both of said applications are incorporated herein by reference.

BACKGROUND OF THE INVENTION

A. Field of the Invention

The present invention is concerned with the ultraviolet polymerization of photopolymerizable binders and vehicles, which polymerization is enhanced considerably by the incorporation of certain sensitizers into said binders.

B. Description of the Prior Art

It is known that the photopolymerization of ethylenically unsaturated monomers can be initiated by exposure to various sources of radiation such as ultraviolet radiation. For example, methyl acrylate on long standing in sunlight will generally transform into a transparent mass. Use of sunlight or sources of comparable energy to photopolymerize monomers or combination of monomers, oligomers, etc., is not practical because of very slow rates of polymerization. Improved rates can be induced by applying thermal energy, particularly in combination with free radical promoting catalysts. Thermal energy or heat for this purpose has been supplied by conventional convection ovens and radiant heat from sources such as infrared lamps to effect the desired rate of polymerization. However, for many applications and especially in the coating arts, heat for curing purposes is no longer satisfactory because (1) it is still slow; (2) it cannot be used with heat-sensitive substrates; and (3) it often requires use of a volatile solvent which can be a potential air pollutant and costly to recycle.

To enhance the rate of polymerization of ethylenically unsaturated organic compounds by exposure to radiation such as ultraviolet, photoinitiators or photosensitizers are included with said organic compounds. For clarity, the term photopolymerizable composition as understood herein refers to that composition which hardens (cures) upon exposure to radiation and which can be a vehicle or a binder for use in surface coatings such as paint, varnish, enamel, lacquer, stain, or ink. Typical photosensitizers have been benzenesulfonyl chloride, p-toluenesulfonyl chloride, naphthalenesulfonyl chloride, zinc and cadium sulfides, and sulfinic compounds.

Typical sources for ultraviolet radiation include a number of commercial units such as electric arc lamps, plasma arc torch (see U.S. Pat. No. 3,364,387) and even lasers having a lasing output in the ultraviolet spectrum (see co-pending application of de Souza and Buhoveckey Ser. No. 189,254). The subject matter of the aforementioned patent applications are incorporated herein by reference.

Advantages of the instant invention over the prior proposals include economical and efficient utilization of ultraviolet energy especially in wavelengths between 3200 and 4000 A to perform "cold" polymerization (curing) of the binders or vehicles at very short exposure times with attendant suppression of losses due to volatilization of components of paint, suppression of discoloration or degradation of resulting deposits which can be generally considered as films, and avoidance of shrinkage and distortion (preservation of dimentional stability) and suppression of degradation of substrate to which the polymerizable vehicle is applied particularly when such substrate is paper, fabric, or plastics.

SUMMARY OF THE INVENTION

In accordance with the present invention, polymerizable compositions comprising ethylenically unsaturated vehicle selected from monomers, oligomers, and prepolymers, and photosensitizers therefor are photopolymerized by exposure to a source of ultraviolet radiation having wavelengths of about 1800 to 4200 A; and wherein said photosensitizer consists essentially of an activated halogenated azine compound and present from about 1 to 10% by weight of the vehicle.

DETAILED DESCRIPTION OF THE INVENTION

The sensitizer, also referred to as the photoinitiator, composition of the present invention comprises an activated halogenated azine compound wherein the activated halogenated moiety refers to substituents selected from halosulfonyl, -haloalkyl, and -haloalkylated aryls. For efficiency and economy, the halo group is preferably chlorine or bromine radical.

Representative azine compounds in accordance with the present invention are listed below with the common name provided in parenthesis.

A. 2-halomethyl-1-benzazine(2-halomethyl quinoline).

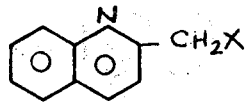

B. 2,4-bis (haloalkyl)-1-benzazine (2,4-bis(haloalkyl) quinoline).

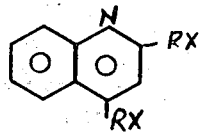

C. 2,6-bis(haloalkyl)-1-benzazine(2,6-bis(haloalkyl) quinoline).

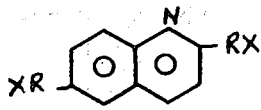

D. 2,7-bis(haloalkyl)-1-benzazine(2,7-bis(haloalkyl) quinoline).

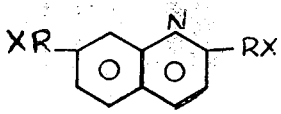

E. 1-haloalkyl-2-benzazine(1-haloalkylisoquinoline).

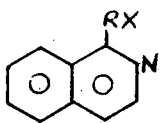

F. 3-haloalkyl-2-benzazine(3-haloalkylisoquinoline).

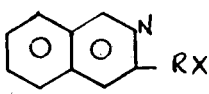

G. 8-Chlorosulfonyl-1-benzazine(8-quinoline sulfonylchloride).

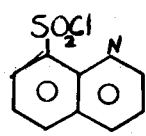

H. 2-haloalkyl-1,4-benzodiazine(2-haloalkylquinoxaline).

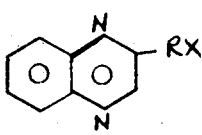

I. 3-haloalkyl-1,4-benzodiazine(3-haloalkylquinoxaline).

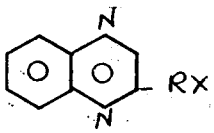

J. 2,3-bis haloalkyl-1,4-benzodiazine(2,3-bishaloalkylquinoxaline).

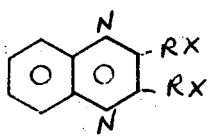

K. 2,5-bis haloalkyl-1,4-diazine(2,5-bishaloalkylpyrazine).

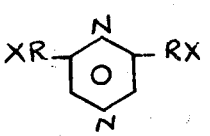

L. 2,6-bis haloalkyl-1,4-diazine(2,6-bishaloalkylpyrazine).

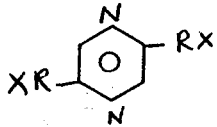

M. 3,5-bis haloalkyl-1,4-diazine(3,5-bishaloalkylpyrazine).

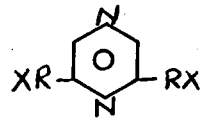

N. 2-Chlorosulfonyl-1,8-benzodiazine(2-Chlorosulfonylnaphthyridine).

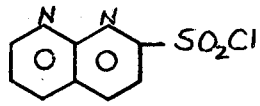

wherein R is a lower alkyl radical, (1–4 carbons) and X is either Cl or Br.

O. 2,5-dibromomethylpyrazine.

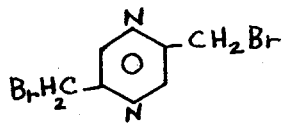

P. 2,6-dibromomethylpyrazine.

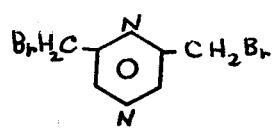

Q. 4,6-dibromomethylpyrimidene.

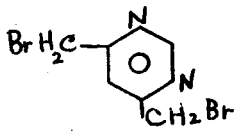

R. 2,4-dibromomethylquinoline.

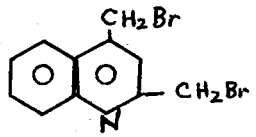

S. 2,7-dibromomethylquinoline.

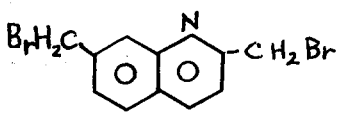

T. 2,6-dibromomethylquinoline.

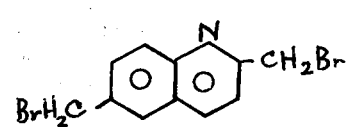

U. 2,3-dibromomethylquinoxaline.

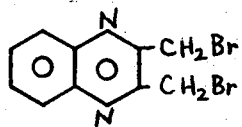

V. 3-bromomethylisoquinoline.

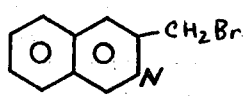

W. 2-bromomethylpyrazine.

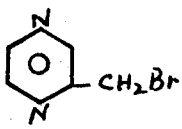

X. 3-bromomethylpyridazine.

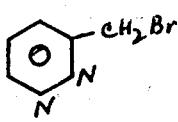

Y. 4-Bromomethylpyrimidine.

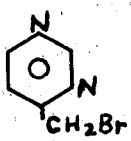

Z. Phenanthridine sulfonyl chloride (mixture) (made from the chlorosulfonation reaction of phenanthridine).

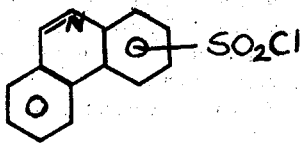

AA. 1,10-phenanthroline sulfonyl chloride (made from the cholorosulfonation reaction of phenanthroline).

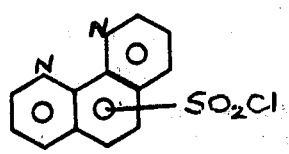

BB. Phenazine sulfonyl chloride (made from the chlorosulfonation of phenazine.

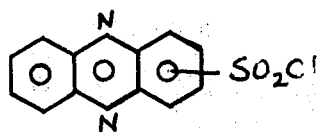

The needed proportion of the sensitizer can be incorporated directly into the binder as a unit of a further polymerizable monomer, oligomer, prepolymer, or polymer. In such instance, for example, the sensitizer compound has a reactable functional group on it such as a carboxyl group or a hydroxyl group. Thus the sensitizer compound can be made to react with a further polymerizable material, e.g., glycidyl acrylate, either in monomeric form or already part of a preformed prepolymer or oligomer.

The sensitizer is present generally from about 1 to about 10% based on the weight of the vehicle. Preferably, the amount incorporated is in the range of about 2 to about 6% by weight.

Typically, the vehicles can constitute the entire deposit or a binder for a clear coating composition. Usually the vehicles are fluid at ordinary operation temperatures (between about 30° and about 300°F. and advantageously between ordinary room temperature and about 180°F.), and when polymerized by the U.V. radiation, give a tack-free film or deposit that is durable enough for ordinary handling. In the cured state such vehicle is resinous or polymeric in nature, usually crosslinked. Uncured for application to a substrate or uncured on such substrate, such vehicle consists essentially of a monomer or mixture of monomers, or a further polymerizable oligomer, prepolymer, resin, or mixture of same, or a resinous material dispersed or dissolved in a solvent that is copolymerizable therewith. Such solvent ordinarily is monomeric, but can be an oligomer (i.e., up to 4 monomer units connected) or prepolymer (mol weight rarely above about 2000). Oligomers and prepolymers should be understood herein as being polymer in nature.

Suitable ethylenically unsaturated compounds which are photopolymerizable with the aid of the above photoinitiators include the various vehicles or binders which can be reactive vinyl monomers such as the lower alkyl esters of acrylic and methacrylic acids or polymer and prepolymers. Vinyl monomers particularly adapted for photopolymerization include methylmethacrylate, ethylmethacrylate, 2-ethylhexyl methacrylate, butyacrylate, isobutyl methacrylate, the corresponding hydroxy acrylates; e.g., hydroxy ethylacrylate, hydroxy propyl acrylate, hydroxy ethylhexyl acrylate, also the glycol acrylates; e.g., ethylene glycol dimethacrylate, hexamethylene glycol dimethacrylate, the allyl acrylates; e.g., allyl methacrylate, diallyl methacrylate, the epoxy acrylates; e.g., glycidyl methacrylate; and the aminoplast acrylates; e.g., melamine acrylate. Others such as vinyl acetate, vinyl and vinylidene halides and amides, e.g., methacrylamide, acrylamide, diacetone acrylamide, and mixtures of polyester and other monomers and polymers such as butadiene, styrene, vinyl toluene, and so forth are also included.

It should be noted that the sensitizers of the present invention not only contribute to the rapid curing of the coating surface, but also to the depth of cure which is quite practical that the resultant polymerized deposit resists scratching or disruption when it is first ostensibly "dry" on the surface. Curing can continue on stored pieces. Typical film thickness for the deposit can be about 0.1 to as high as 10 mils. Preferred cured deposits are continuous films, but decorative or message-transmitting ones need not be.

Typically, the substrate workpieces coated with the uncured deposit or deposits are passed under a V.V.-providing light beam by a conveyor moving at predetermined speeds. The substrate being coated can be metal, mineral, glass, wood, paper, plastic, fabric, ceramic, etc.

A distinct advantage of the present invention is that the azine sensitizers can be incorporated, in modest proportions, into the vehicles without much deleterious effects. In fact, filler materials in the binder can be tolerated upwards of 20% by weight of the binder. Such filler materials can be basic lead sulfate, magnesium silicate, silica, clays, wollastonite, talcs, mica, chromates, iron pigments, wood flour, microballoons, hard polymer particles, and even reinforcing glass fiber or flake. Generally, little to no pigments are used in photopolymerizable vehicles because of the attendant difficulty of rapid curing. It is believed that pigment paricles tend to absorb the bulk of the useful ultraviolet radiation leaving only a minor portion of said radiation to energize the sensitizers and generate the requisite amount of necessary free radicals. This is particularly true in the case of rutile-type pigments. Thus the lack of photoinitiating activities of my sensitizers in heavily pigmented systems is not unexpected. In this respect and for excellent photoinitiation of pigmented systems my azine sensitizers should be combined with a thioxanthone compound as fully disclosed in my co-pending patent application Serial No. 413,830 filed Nov. 8, 1973, and now U.S. Pat. No. 3,957,769 said application is assigned to the same assignee as the present invention.

The following examples show ways in which this invention has been practiced, but should not be construed as limiting it. Unless otherwise specifically stated herein, all parts are parts by weight, all percentages are weight percentages and all temperatures are in degrees Fahrenheit. Where the binder vehicle being cured is of the type normally curable by free-radical polymerization, it is sometimes advantageous for completeness of cure and speed to maintain a substantially inert atmosphere above the irradiated workpiece. Generally this is effected by maintaining a purge of nitrogen or other inert gas or placing over the workpiece a thin film of transparent polyethylene.

EXAMPLE 1

A number of acrylic resins and combinations thereof were utilized in evaluating the photoinitiator of the present invention. For convenience, the polymerizable binder composition comprises three acrylic resins in equal proportions. These resins were acrylic monomers, diacrylate, and triacrylate oligomers.

A polymerizable composition consisting of ⅓ 2-ethylhexyl acrylate, ⅓ ethylene glycol diacrylate, and ⅓ trimethylolpropane triacrylate was prepared with various photoinitiators in accordance with the present invention.

Each sensitized binder composition was poured over a pair of steel panels and drawn down with a No. 8 wound wire rod to a film thickness or coating of approximately 0.5 mil. The coated but wet panels were each exposed to a different source of ultraviolet light; one provided from a plasma arc radiation source (PARS) and the other from a conventional ultraviolet light supplied by Ash Dee Corporation, said light having two 4,000 watt mercury lamps. Exposure times were from 0.07 sec. to 30 secs., with the panels being placed approximately 5 inches from the ultraviolet source. These exposure times for the plasma arc are calculated from the speed of the conveyor belt on which the panels are placed. For example, a speed rate of 300 feet per minute corresponds to 0.07 second exposure time, whereas the speed of approximately 86 to 100 feet per minute corresponds to 0.2 seconds. The photopolymerization was done in an inert atmosphere (protection of the sensitized binder was effected by a clear sheet of polyethylene).

In Table 1 there are shown the results of subjecting panels coated with the sensitized compositions to U.V. radiations from the PARS and Ash Dee units.

TABLE 1

| Photoinitiator % wt. | U.V. Source | Time, Sec. | Cure |
|---|---|---|---|
| 2,3-bis(bromomethyl)-1,4-benzodiazine, 2% | PARS | 0.2 | Hard |
| 2,3-bis(bromomethyl)-1,4-benzodiazine, 2% | Ash Dee | 7 | '' |
| 8-chlorosulfonyl-1-benzazine, 2% | PARS | 0.2 | '' |
| 8-chlorosulfonyl-1-benzazine, 2% | Ash Dee | 7 | '' |
| 3-Bromomethyl-2-benzazine, 3% | PARS | 0.2 | Hard |
| 3-Bromomethyl-2-benzazine, 3% | Ash Dee | 7 | Hard |

EXAMPLE II

Into the vehicle of Example I was introduced 10% of rutile TiO₂ pigment. Utilizing the sensitizers and irradiation of Example 1, the results were comparable in that complete cure was obtained.

EXAMPLE III

The coating system (vehicle) used was prepared from ⅓ 2-hydroxyethyl acrylate, ⅓ pentaerythritoltriacrylate, ⅓ 1,6 hexanedioldiacrylate. Each of the following sensitizers was added to the coating at 2% by weight. The coating was drawn down onto steel panels with a No. 3 WW rod, covered with a clear polyethylene overlay, and irradiated for 10 sec. under a 2 bulb Ash Dee curing unit. In all cases the result was a fully cured film, tack free, F to H hardness, and over 100 MEK rubs resistance. The sensitizers were: G, N, O, P, Q, R, S, T, U, V, W, X, Y, Z, AA, BB described earlier.

EXAMPLE IV

Same as Example III, but the coating system used was prepared from ⅓ DOW epoxy resin DER 332 diacrylate, ⅓ phenylcellusolve acrylate, ⅓ trimethylolpropane triacrylate.

The results are the same as Example I.

EXAMPLE V

Same as Example III, but the coating system was prepared from ¼ styrene, ¼ polyester resin (2 parts maleic + 1 part ethylene glycol), ¼ pentaerythritoltriacrylate, ¼ divinyl benzene. The results showed complete cure with comparable properties as described in Example III.

EXAMPLE VI

The vehicle in this example was prepared from ⅓ styrene, ⅓ polyester resin (3 parts maleic anhydride, 2 parts ethylene glycol), and ⅓ polybutadiene resin (M. Wt. = 2200 90% vinyl L & H resin). This system utilized the sensitizers of Examples I and IV and the Ash Dee Unit was used for 20 sec. exposure time and the results were the same as described in Example III.

EXAMPLE VII

The vehicle in this example was prepared from ⅓ styrene, ⅓ polyester resin, (50% maleic, 50% propylene glycol, and ⅓ ethyleneglycoldimethyl acrylate. Utilizing the sensitizers of both Examples I and III for 20 secs. under the Ash Dee unit, the cure was complete with properties similar to those described in Example III.

What I claim is:

1. A photopolymerizable composition consisting essentially of (1) a polymerizable ethylenically unsaturated vehicle selected from the group consisting of monomers, oligomers, prepolymers, and mixtures thereof, (2) from about 1.0 to about 10% by weight based on the weight of the vehicle of an activated halogenated azine photosensitizer selected from the group consisting of activated halogenated benzazines, benzodiazines, diazines, and mixtures thereof, said azine is characterized by having a substituted radical selected from chlorosulfonyl, $\alpha$-haloalkyl, and $\alpha$-haloalkylated aryls, and (3) from 0 to about 20% by weight of the vehicle of an opacifying pigment.

2. The photopolymerizable composition of claim 1 wherein the azine photosensitizer is 8-chlorosulfonyl-1-benzazine.

3. The photopolymerizable composition of claim 1 wherein the azine photosensitizer is $\alpha$-bromo (lower) alkyl benzazine.

4. The photopolymerizable composition of claim 1 wherein the azine is a bis-bromomethyl diazine.

5. The photopolymerizable composition of claim 1 wherein the azine is a chlorosulfonated benzodiazine.

6. A process for photopolymerizing a polymerizable vehicle selected from the group consisting of ethylenically unsaturated monomers, oligomers, prepolymers, or mixtures thereof, by exposure to U.V. radiation, which comprises incorporating into said vehicle from about 1.0 to about 10% by weight of an activated halogenated azine photosensitizer selected from activated halogenated benzazines, benzodiazines, diazines, and mixtures thereof.

* * * * *

UNITED STATES PATENT OFFICE
CERTIFICATE OF CORRECTION

Patent No. 3,959,100           Dated May 25, 1976

Inventor(s) Vincent D. McGinniss

It is certified that error appears in the above-identified patent and that said Letters Patent are hereby corrected as shown below:

Column 7, line 2, correct V.V. to read "U.V.";
        line 30, correct patent No. 3,957,769 to read "3,857,769".

Signed and Sealed this

Twelfth Day of October 1976

[SEAL]

Attest:

RUTH C. MASON
Attesting Officer

C. MARSHALL DANN
Commissioner of Patents and Trademarks

UNITED STATES PATENT AND TRADEMARK OFFICE
CERTIFICATE OF CORRECTION

PATENT NO. : 3,959,100
DATED : May 25, 1976
INVENTOR(S) : Vincent Daniel McGinniss It is certified that error appears in the above—identified patent and that said Letters Patent are hereby corrected as shown below:

Column 3, The graphic formulas under compounds K and L should be transposed.

Column 7, line 2, correct V.V. to read "U.V.";

line 30, correct Patent No. 3,957,769 to read "3,857,769".

This certificate supersedes Certificate of Correction issued October 12, 1976.

Signed and Sealed this

Twenty-third Day of November 1976

[SEAL]

Attest:

RUTH C. MASON
*Attesting Officer*

C. MARSHALL DANN
*Commissioner of Patents and Trademarks*